US012663729B2

(12) United States Patent
Swillam et al.

(10) Patent No.: US 12,663,729 B2
(45) Date of Patent: Jun. 23, 2026

(54) ON CHIP SENSOR FOR WAFER OVERLAY MEASUREMENT

(71) Applicants: ASML Holding N.V., Veldhoven (NL); ASML Netherlands B.V., Veldhoven (NL)

(72) Inventors: Mohamed Swillam, Wilton, CT (US); Stephen Roux, New Fairfield, CT (US); Tamer Mohamed Tawfik Ahmed Mohamed Elazhary, New Canaan, CT (US); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 176 days.

(21) Appl. No.: 18/769,032

(22) Filed: Jul. 10, 2024

(65) Prior Publication Data

US 2024/0361703 A1      Oct. 31, 2024

Related U.S. Application Data

(63) Continuation of application No. 17/637,942, filed as application No. PCT/EP2020/072063 on Aug. 5, 2020, now Pat. No. 12,066,762.

(Continued)

(51) Int. Cl.
| | |
|---|---|
| *G03F 7/20* | (2006.01) |
| *G02B 6/122* | (2006.01) |

(Continued)

(52) U.S. Cl.
CPC ....... *G03F 7/70633* (2013.01); *G02B 6/1225* (2013.01); *G02B 26/0833* (2013.01)

(58) Field of Classification Search
CPC . G03F 7/70633; G03F 7/7085; G02B 6/1225; G02B 26/0833; G02B 6/02314; G02B 6/262; G02B 6/4298
See application file for complete search history.

(56) References Cited

U.S. PATENT DOCUMENTS

| | | | |
|---|---|---|---|
| 9,128,065 | B2 | 9/2015 | Cramer et al. |
| 12,066,762 | B2 | 8/2024 | Swillam et al. |

(Continued)

FOREIGN PATENT DOCUMENTS

| | | |
|---|---|---|
| CN | 1476551 A | 2/2004 |
| CN | 102124412 A | 7/2011 |

(Continued)

OTHER PUBLICATIONS

International Search Report and Written Opinion of the International Searching Authority directed to related International Patent Application No. PCT/EP2020/072063, mailed Dec. 2, 2020; 9 pages.

(Continued)

*Primary Examiner* — Mesfin T Asfaw
(74) *Attorney, Agent, or Firm* — FINNEGAN, HENDERSON, FARABOW, GARRETT & DUNNER, LLP

(57) ABSTRACT

A sensor apparatus includes a sensor chip, an illumination system, a first optical system, a second optical system, and a detector system. The illumination system is coupled to the sensor chip and transmits an illumination beam along an illumination path. The first optical system is coupled to the sensor chip and includes a first integrated optic to configure and transmit the illumination beam toward a diffraction target on a substrate, disposed adjacent to the sensor chip, and generate a signal beam including diffraction order sub-beams generated from the diffraction target. The second optical system is coupled to the sensor chip and includes a (Continued)

second integrated optic to collect and transmit the signal beam from a first side to a second side of the sensor chip. The detector system is configured to measure a characteristic of the diffraction target based on the signal beam transmitted by the second optical system.

20 Claims, 11 Drawing Sheets

Related U.S. Application Data

(60) Provisional application No. 62/893,256, filed on Aug. 29, 2019.

(51) Int. Cl.
    *G02B 26/08*    (2006.01)
    *G03F 7/00*    (2006.01)

(56) References Cited

U.S. PATENT DOCUMENTS

| | | |
|---|---|---|
| 2002/0075911 A1 | 6/2002 | Cham et al. |
| 2004/0163563 A1 | 8/2004 | Sreenivasan et al. |
| 2007/0295891 A1 | 12/2007 | Wang et al. |
| 2010/0007885 A1 | 1/2010 | Li |
| 2011/0194088 A1 | 8/2011 | Butler et al. |
| 2013/0278942 A1 | 10/2013 | Jeong et al. |
| 2013/0292786 A1 | 11/2013 | Sengupta |
| 2015/0204664 A1 | 7/2015 | Bringoltz et al. |
| 2015/0276612 A1 | 10/2015 | Fattinger |
| 2015/0362905 A1 | 12/2015 | Liou et al. |
| 2017/0097574 A1 | 4/2017 | Goodwin et al. |
| 2019/0079484 A1 | 3/2019 | Straaijer |
| 2019/0155172 A1 | 5/2019 | Shmarev et al. |
| 2020/0057387 A1 | 2/2020 | Pandey |
| 2020/0072599 A1 | 3/2020 | Van Dam et al. |
| 2020/0209757 A1 | 7/2020 | Butler et al. |

FOREIGN PATENT DOCUMENTS

| | | |
|---|---|---|
| CN | 105225978 A | 1/2016 |
| CN | 109564392 A | 4/2019 |
| EP | 1628164 A2 | 2/2006 |
| TW | 2010-44116 A | 12/2010 |
| TW | 2019-21148 A | 6/2019 |
| WO | WO 2011/104171 A1 | 9/2011 |
| WO | WO 2019/115278 A1 | 6/2019 |

OTHER PUBLICATIONS

International Preliminary Report on Patentability directed to related International Patent Application No. PCT/EP2020/072063, issued Mar. 1, 2022; 7 pages.

ON CHIP SENSOR FOR WAFER OVERLAY MEASUREMENT

CROSS-REFERENCE TO RELATED APPLICATIONS

This application is a continuation of U.S. application Ser. No. 17/637,942, filed Feb. 24, 2022, which is a National Stage Entry of PCT/EP2020/072063, filed Aug. 5, 2020, which claims priority from U.S. application No. 62/893,256, filed Aug. 29, 2019, and which is incorporated herein in its entirety by reference.

FIELD

The present disclosure relates to sensor apparatuses and systems for lithographic apparatuses and systems, for example.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In order to control the lithographic process to place device features accurately on the substrate, one or more diffraction targets (i.e., alignment marks) are generally provided on, for example, the substrate, and the lithographic apparatus includes one or more overlay sensors by which overlay errors (i.e., due to the interaction between sensors) or on-process accuracy errors (OPAEs), based on varying stack thicknesses, materials, and/or processes on each wafer (i.e., process variations), can be measured accurately utilizing the diffraction target (i.e., micro diffraction-based overlay).

Self-aligned and compact systems can provide improved accuracy, cost efficiency, and scalability since hundreds of sensors can be implemented on the same common platform. Integration of components (e.g., illumination source, fibers, mirrors, lenses, waveguides, detectors, processor, etc.) can provide a miniaturized sensor for measuring a particular characteristic (e.g., overlay, etc.) of an alignment mark on a substrate. Additionally, multiple alignment marks of the same substrate can be investigated by multiple sensors (e.g., sensor array) and different measurements can be conducted simultaneously or in real-time.

Accordingly, there is a need to compensate for variations in a sensor apparatus and system, and provide a reduced footprint and self-aligned compact sensor that is scalable and capable of measuring micro diffraction-based overlay.

SUMMARY

In some embodiments, a sensor apparatus includes a sensor chip, an illumination system, a first optical system, a second optical system, and a detector system. The sensor chip includes a first side and a second side opposite the first side. The illumination system is coupled to the sensor chip and configured to transmit an illumination beam along an illumination path. The first optical system is coupled to the sensor chip and includes a first integrated optic configuration to configure and transmit the illumination beam toward a diffraction target on a substrate, disposed adjacent to the sensor chip, and generate a signal beam including diffraction order sub-beams generated from the diffraction target. The second optical system is coupled to the sensor chip and includes a second integrated optic configuration to collect and transmit the signal beam from the first side to the second side of the sensor chip. The detector system is configured to measure a characteristic of the diffraction target based on the signal beam transmitted by the second optical system.

In some embodiments, the characteristic of the diffraction target is an overlay measurement.

In some embodiments, the illumination system includes an optical fiber disposed on the sensor chip and coupled to the first optical system. For example, the optical fiber can include a photonic crystal fiber. In some embodiments, the illumination system can include a free space coupling from an external source or an on chip source coupled directly to the sensor chip.

In some embodiments, the first integrated optic configuration includes a mirror and an integrated waveguide disposed on the first side of the sensor chip. For example, the integrated waveguide can include a photonic crystal waveguide. In some embodiments, the mirror includes a micro-electromechanical system-based actuator configured to focus the illumination beam onto the diffraction target. In some embodiments, the photonic crystal waveguide includes the same bandgap as the photonic crystal fiber. In some embodiments, the illumination beam wavelength is about 400 nm to about 2000 nm.

In some embodiments, the illumination system includes a plurality of optical fibers or optical sources coupled to the sensor chip and coupled to the first optical system including a plurality of waveguides. For example, the plurality of optical fibers or optical sources can include a plurality of photonic crystal fibers. For example, the plurality of waveguides can include a plurality of photonic crystal waveguides. In some embodiments, the plurality of optical fibers or optical sources and the plurality of waveguides are arranged symmetrically relative to each other and configured to focus the illumination beam onto the diffraction target. For example, the plurality of optical fibers or optical sources can include a plurality of photonic crystal fibers and the plurality of waveguides can include a plurality of photonic crystal waveguides.

In some embodiments, an area of the first side of the sensor chip is no greater than about 5 mm by 5 mm.

In some embodiments, the second integrated optic configuration comprises a negative lens, a positive lens, a meta lens, or a through-hole. In some embodiments, the meta lens is a flat Fresnel lens. In some embodiments, the meta lens is a nanostructured surface lens.

In some embodiments, the detector system includes a first detector, a second detector, a wavelength filter, and a focusing optic. In some embodiments, the first detector is configured to detect an infrared range of the signal beam from about 700 nm to about 2000 nm and the second detector is configured to detect an ultraviolet-visible range of the signal beam from about 10 nm to about 700 nm. In some embodiments, the second detector is configured to detect ultraviolet-visible and infrared ranges of the signal beam from about 10 nm to about 2000 nm.

In some embodiments, the illumination system, the first optical system, and the second optical system are integrated on the same substrate. For example, the illumination system, the first optical system, and the second optical system can be integrated on the sensor chip.

In some embodiments, a detection system includes a plurality of sensors and a processor. The plurality of sensors are arranged symmetrically relative to each other and disposed above a plurality of diffraction targets on a substrate. Each sensor includes a sensor chip, an illumination system, a first optical system, a second optical system, and a detector system. The sensor chip includes a first side and a second side opposite the first side. The illumination system is coupled to the sensor chip and configured to transmit an illumination beam along an illumination path. The first optical system is coupled to the sensor chip and includes a first integrated optic configuration to configure and transmit the illumination beam toward a diffraction target on the substrate, disposed adjacent to the sensor chip, and generate a signal beam including diffraction order sub-beams generated from the diffraction target. The second optical system is coupled to the sensor chip and includes a second integrated optic configuration to collect and transmit the signal beam from the first side to the second side of the sensor chip. The detector system is configured to measure a characteristic of the diffraction target based on the signal beam transmitted by the second optical system. The processor is coupled to each sensor and configured to determine a processing error based on the characteristic of each diffraction target of the plurality of diffraction targets on the substrate.

In some embodiments, the characteristic of the diffraction target is an overlay measurement.

In some embodiments, each detector system measures the characteristic of the plurality of diffraction targets on the substrate simultaneously. In some embodiments, the plurality of sensors are integrated on a common platform. In some embodiments, the processor is coupled to each sensor via an optical fiber.

In some embodiments, a method for correcting a processing error includes measuring, by a plurality of sensors, a characteristic of a plurality of diffraction targets on the substrate. Each sensor includes a sensor chip, an illumination system, a first optical system, a second optical system, and a detector system. The sensor chip includes a first side and a second side opposite the first side. The illumination system is coupled to the sensor chip and configured to transmit an illumination beam along an illumination path. The first optical system is coupled to the sensor chip and includes a first integrated optic configuration to configure and transmit the illumination beam toward a diffraction target on the substrate, disposed adjacent to the sensor chip, and generate a signal beam including diffraction order sub-beams generated from the diffraction target along a signal path. The second optical system is coupled to the sensor chip and includes a second integrated optic configuration to collect and transmit the signal beam from the first side to the second side of the sensor chip. The detector system is configured to measure the characteristic of the diffraction target based on the signal beam transmitted by the second optical system. In some embodiments, the method further includes determining, by a processor coupled to each sensor, the characteristic of each diffraction target. In some embodiments, the method further includes correcting the processing error of a lithographic apparatus, a sensor, or the substrate based on the characteristic of each diffraction target.

In some embodiments, the measuring the characteristic of the plurality of diffraction targets on the substrate occurs simultaneously. In some embodiments, the method further includes adjusting the first integrated optic configuration to an out-of-focus position on the diffraction target. In some embodiments, the first integrated optic configuration includes a microelectromechanical system-based adjustable mirror configured to focus the illumination beam toward the diffraction target.

In some embodiments, a lithographic apparatus includes an illumination system, a projection system, and a sensor apparatus. The illumination system is configured to illuminate a patterning device. The projection system is configured to project an image of the patterning device onto a substrate. The sensor apparatus is configured to measure a characteristic of a diffraction target on the substrate. The sensor apparatus includes a sensor chip, a second illumination system, a first optical system, a second optical system, and a detector system. The sensor chip includes a first side and a second side opposite the first side. The second illumination system is coupled to the sensor chip and configured to transmit an illumination beam along an illumination path. The first optical system is coupled to the sensor chip and includes a first integrated optic configuration to configure and transmit the illumination beam toward the diffraction target on the substrate, disposed adjacent to the sensor chip, and generate a signal beam including diffraction order sub-beams generated from the diffraction target. The second optical system is coupled to the sensor chip and includes a second integrated optic configuration to collect and transmit the signal beam from the first side to the second side of the sensor chip. The detector system is configured to measure the characteristic of the diffraction target based on the signal beam transmitted by the second optical system.

In some embodiments, the characteristic of the diffraction target is an overlay measurement. In some embodiments, an area of the first side of the sensor chip is no greater than about 5 mm by 5 mm. In some embodiments, the sensor apparatus includes a plurality of sensors arranged symmetrically relative to each other and disposed above a plurality of diffraction targets on the substrate. In some embodiments, each sensor measures a characteristic of the plurality of diffraction targets on the substrate simultaneously.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
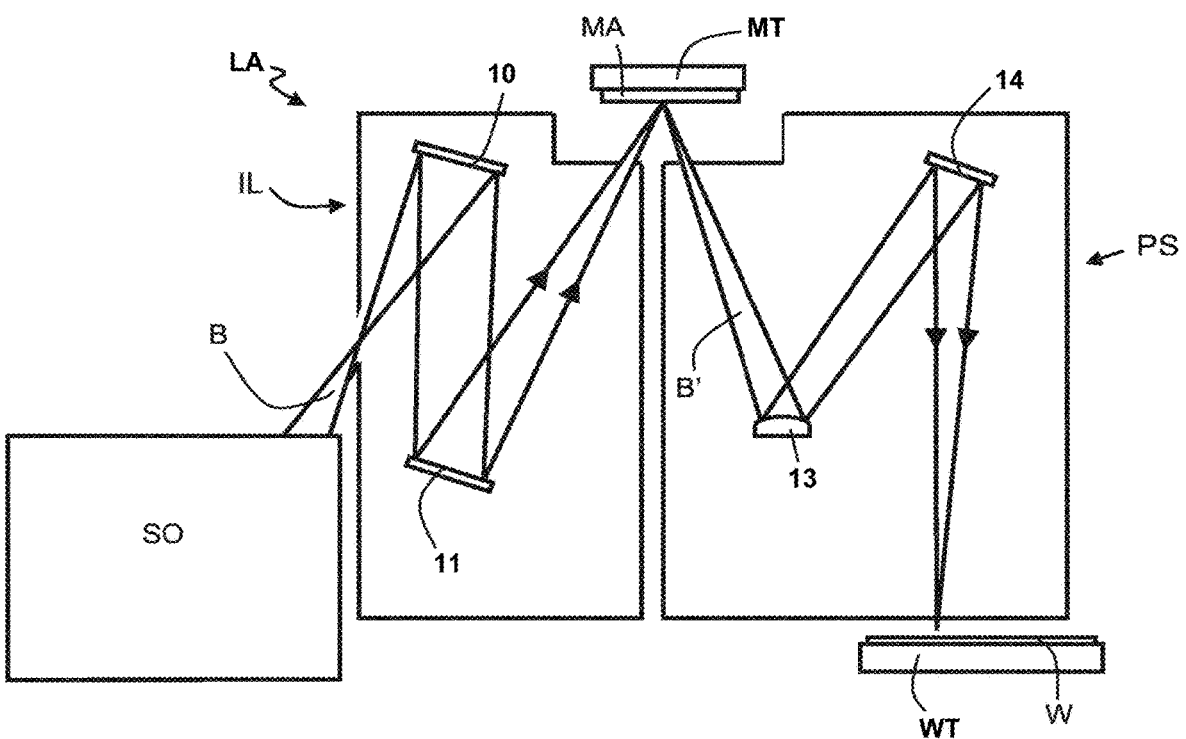
FIG. 1 is a schematic illustration of a lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Lithographic System

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL), or any other radiation source that is capable of generating EUV radiation.

Exemplary Sensor Apparatus

As discussed above, on-process accuracy errors (OPAEs) are caused by varying stack thicknesses, materials, and/or processes on each wafer (i.e., process variations) and overlay errors due to the interaction between sensors. Process variations change the optical properties of reflected light from an alignment mark on a substrate, which causes OPAEs. Despite various techniques, such as mark asymmetry reconstruction (MAR), which corrects for asymmetries in an alignment mark, improved sensors (e.g., SMASH), and predictive modeling, wafer stack properties variations (i.e., process variations) cause a lower limit for OPAEs and cannot be reduced further using current techniques and systems.

Self-aligned and compact sensor systems can provide better accuracy, cost efficiency, and scalability. Compact sensors, on the order of about 5 mm×5 mm, implemented on the same common platform can form a sensor array of hundreds of sensors. These miniaturized sensors (e.g., 5 mm×5 mm) can measure a particular characteristic (e.g., overlay error, OPAE, etc.) of an alignment mark on a substrate. Also, integration of components (e.g., illumination source, fibers, mirrors, lenses, detector, processor, etc.) in a single "on chip" sensor can improve miniaturization. Further, an integrated lens can be utilized to further reduce size restraints of collection systems for diffraction-based measurements. Additionally, multiple alignment marks of the same substrate can be investigated by multiple sensors (e.g., sensor array) and different measurements can be conducted simultaneously or in real-time.

FIGS. 2 through 5 illustrate sensor apparatus 200, according to various exemplary embodiments.

Figure 2:
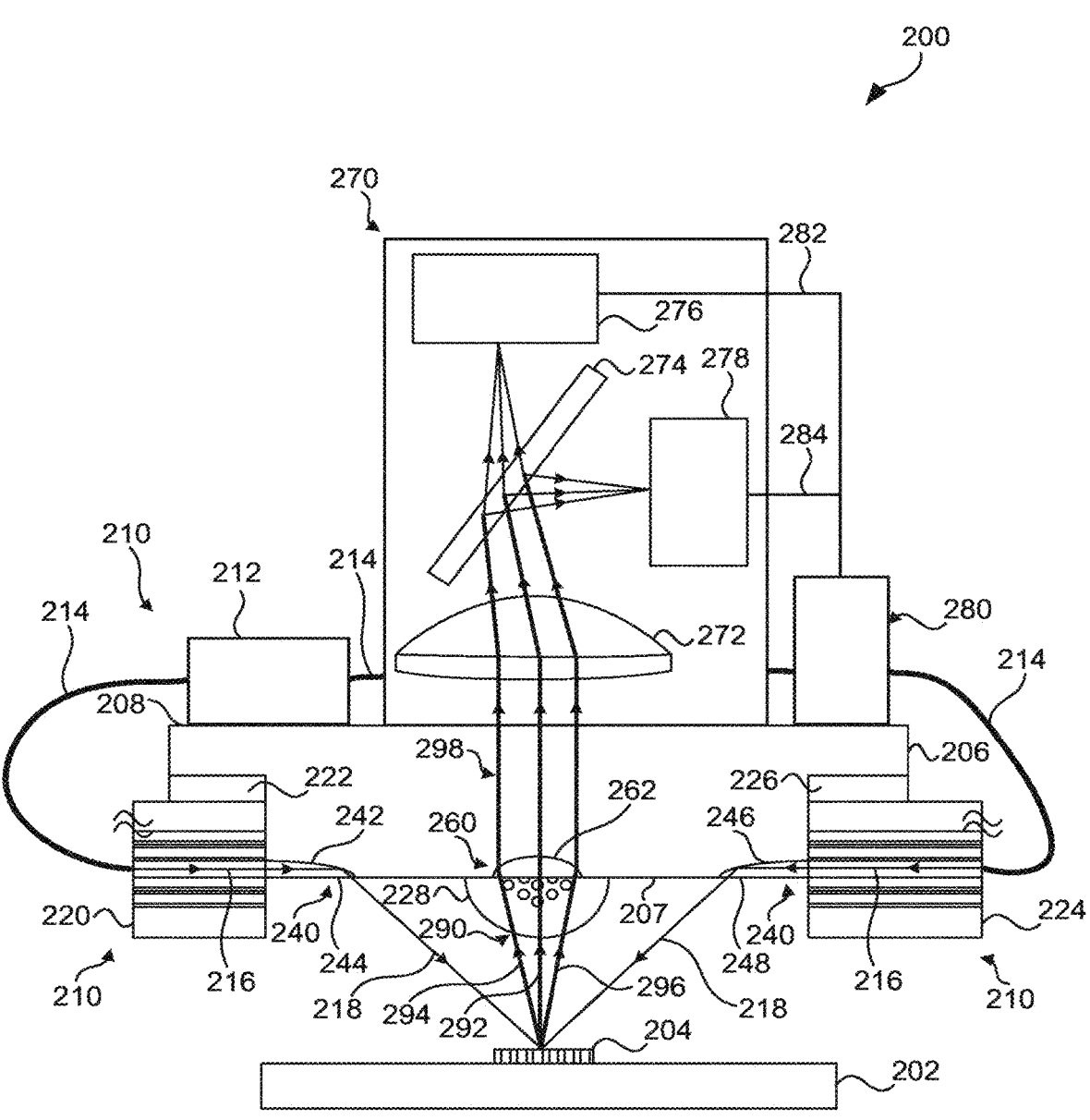
FIG. 2 is a cross-sectional schematic illustration of a sensor apparatus, according to an exemplary embodiment.

FIG. 2 illustrates a cross-sectional schematic of sensor apparatus 200, according to an exemplary embodiment. Sensor apparatus 200 is configured to measure a characteristic (e.g., overlay error, OPAE, etc.) of diffraction target 204 on substrate 202 and can correct a processing error (e.g., OPAE, etc.) and improve overlay, for example, in lithographic apparatus LA.

Sensor apparatus 200 can include sensor chip 206, illumination system 210, first optical system 240, second optical system 260, detector system 270, and processor 280. Although sensor apparatus 200 is shown in FIG. 2 as a stand-alone apparatus, the embodiments of this disclosure are not limited to this example, and sensor apparatus 200 embodiments of this disclosure can be used with or used in other optical systems, such as, but not limited to, lithographic apparatus LA and/or other optical systems.

Sensor chip 206 is configured to support illumination system 210, first optical system 240, second optical system 260, detector system 270, and/or processor 280. Sensor chip 206 includes first side 207 and second side 208 opposite first side 207. First side 207 is configured to face diffraction target 204 of substrate 202. Sensor chip 206 is coupled to illumination system 210, first optical system 240, second optical system 260, detector system 270, and/or processor 280. For example, as shown in FIG. 2, illumination source 212 of illumination system 210, detector system 270, and processor 280 are disposed on second side 208, and first and second photonic crystal fibers 220, 224 of illumination system 210, first optical system 240, and second optical system 260 are disposed adjacent first side 207. As shown in FIG. 2, sensor chip 206 can be a three-dimensional orthotope, for example, a cube. Sensor chip 206 can be any suitable optically transparent rigid structure configured to transmit a collected signal beam 290 generated from diffraction target 204. For example, sensor chip 206 can be a semiconductor (e.g., Si, Ge, SiGe, GaAs, etc.) or an oxide (e.g., $SiO_x$, $SiN_x$, $ZnO_x$, $NiO_x$, $SnO_x$, $In_xO_x$, $Al_xO_x$, $Ga_xO_x$, $CaO_x$, $CuO_x$, ITO, etc.). Sensor chip 206 can be a compact structure with first side 207 having a planar area no greater than about 5 mm×5 mm.

In some embodiments, as shown in FIG. 2, illumination system 210, first optical system 240, and second optical system 260 can be integrated on sensor chip 206. In some embodiments, illumination source 212 of illumination system 210 can be external to sensor chip 206 and coupled to sensor chip 206, for example, by a fiber optic cable. In some embodiments, detector system 270 can be external to sensor chip 206 and coupled to sensor chip 206, for example, by a fiber optic cable. In some embodiments, processor 280 can be external to sensor chip 206 and coupled to sensor chip 206, for example, by a fiber optic cable.

Illumination system 210 is configured to transmit illumination beam 216 along illumination path 218 toward diffraction target 204. Illumination system 210 includes illumination source 212, illumination coupling 214, illumination beam 216, and first photonic crystal fiber (PCF) 220. Illumination source 212 is produces illumination beam 216 and is coupled to first PCF 220 via illumination coupling 214, for example, a fiber optic cable.

Illumination system 210 can be configured to provide an electromagnetic broadband illumination beam 216 having one or more passbands. In an example, the one or more passbands may be within a spectrum of wavelengths between about 400 nm to about 2000 nm. In an example, the one or more passbands may be within a spectrum of wavelengths between about 10 nm to about 700 nm. In another example, the one or more passbands may be within a spectrum of wavelengths between about 700 nm to about 2000 nm. Illumination system 210 can be further configured to provide one or more passbands having substantially constant center wavelength (CWL) values over a long period of time (e.g., over a lifetime of illumination system 210). Such configuration of illumination system 210 can help to prevent the shift of the actual CWL values from the desired CWL values, as discussed above, in current alignment systems. And, as a result, the use of constant CWL values may improve long-term stability and accuracy of sensor systems (e.g., sensor apparatus 200) compared to the current apparatuses.

In some embodiments, illumination system 210 can use a broadband light source (i.e., one with a wide range of light frequencies or wavelengths—and, thus, of colors) for a radiation source that may give a large etendue (i.e., spread of light, e.g., the product of the area (A) of the source and the solid angle (Ω) that the system's entrance pupil subtends as seen from the source), allowing the mixing of multiple wavelengths. In some embodiments, illumination beam 216 can include a plurality of wavelengths in the broadband and preferably may each have a bandwidth of Δλ and a spacing of at least 2→λ (i.e., twice the bandwidth). In some embodiments, illumination system 210 can include several "sources" of radiation for different portions of an extended radiation source that have been split using fiber bundles. In this way, angle resolved scatter spectra can be measured at multiple wavelengths in parallel. For example, a 3-D spectrum (wavelength and two different angles) can be measured, which contains more information than a 2-D spectrum. This allows more information to be measured, which increases metrology process robustness. This is described in more detail in EP 1628164 A2, which is incorporated by reference herein in its entirety.

Photonic crystal fibers (PCFs) are a class of optical fiber based on properties of photonic crystals, which affect the motion of photons due to their periodic optical nanostructure, and are a subclass of microstructured optical fiber where photons are guided by structural modifications. PCFs are divided into two categories: (1) high index guiding fibers (e.g., solid core—high index core); and (2) low index guiding fibers (e.g., photonic bandgap (PBG)—low index core). A special class of low index guiding fibers includes hollow-core fibers, which are further divided into two categories: (1) PBG fibers; and (2) anti-resonance fibers (e.g., "negative curvature" core surround, anti-resonant nodeless tube-lattice fiber (ANF)). Photonic bandgap (PBG) fibers confine light by bandgap effects. Due to the highly periodic structure in the cladding, surrounding the core of the fiber, a photonic bandgap is created such that photons with frequencies within the PBG cannot propagate out through the cladding and are confined to the core.

First PCF 220 is configured to receive illumination beam 216 from illumination coupling 214 and transmit illumination beam 216 to first optical system 240. First PCF 220 can be any suitable optical material capable of forming a photonic bandgap (PBG). For example, first PCF 220 can be a semiconductor (e.g., Si, Ge, SiGe, GaAs, InP, etc.) or a dielectric. First PCF 220 is coupled to first optical system 240. For example, as shown in FIG. 2, an output port of first PCF 220 is adjacent first mirror 242 and first photonic crystal waveguide 244 of first optical system 240.

Figure 3:
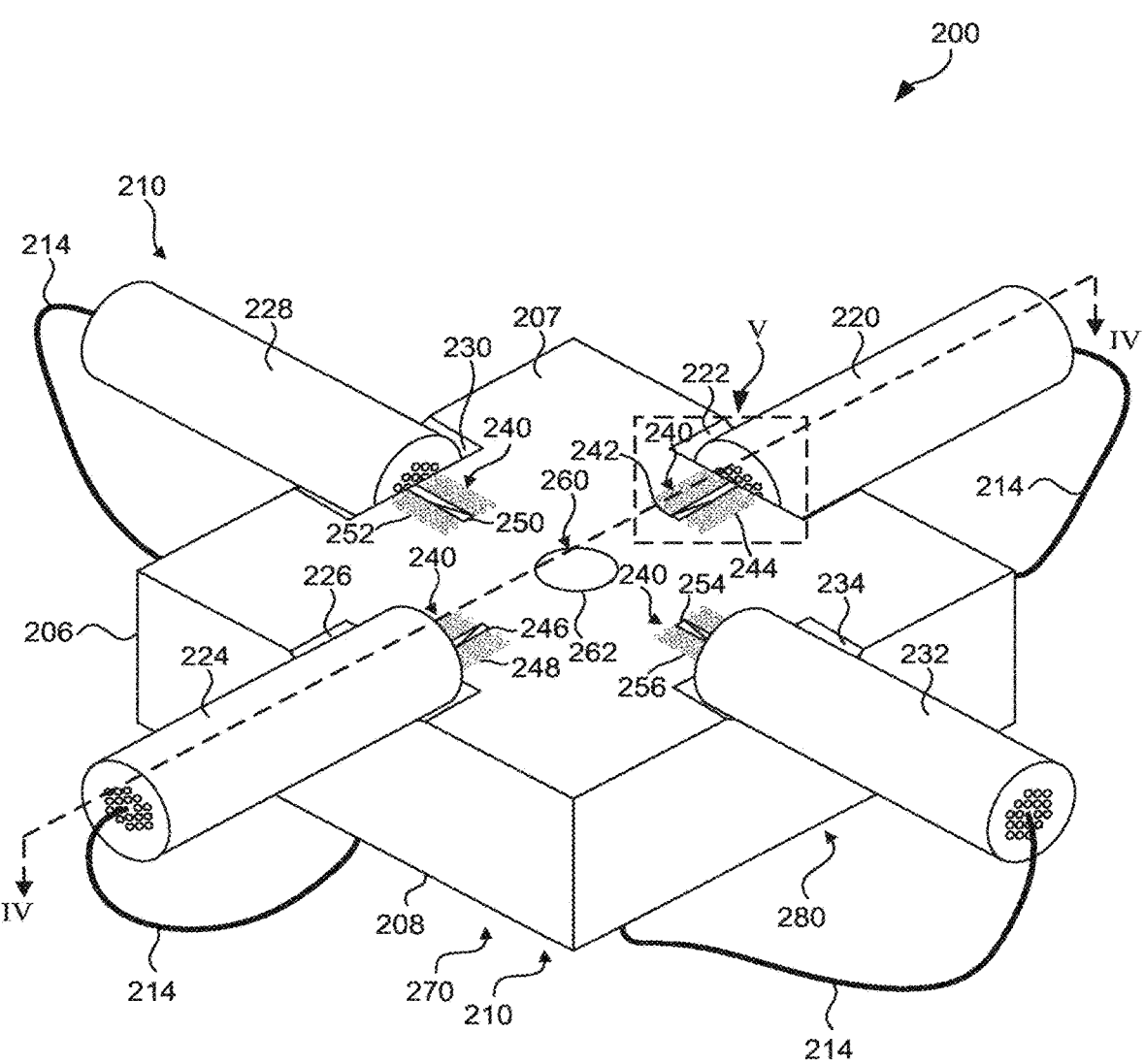
FIG. 3 is a bottom perspective schematic illustration of the sensor apparatus of FIG. 2.
Figures 6, 7:
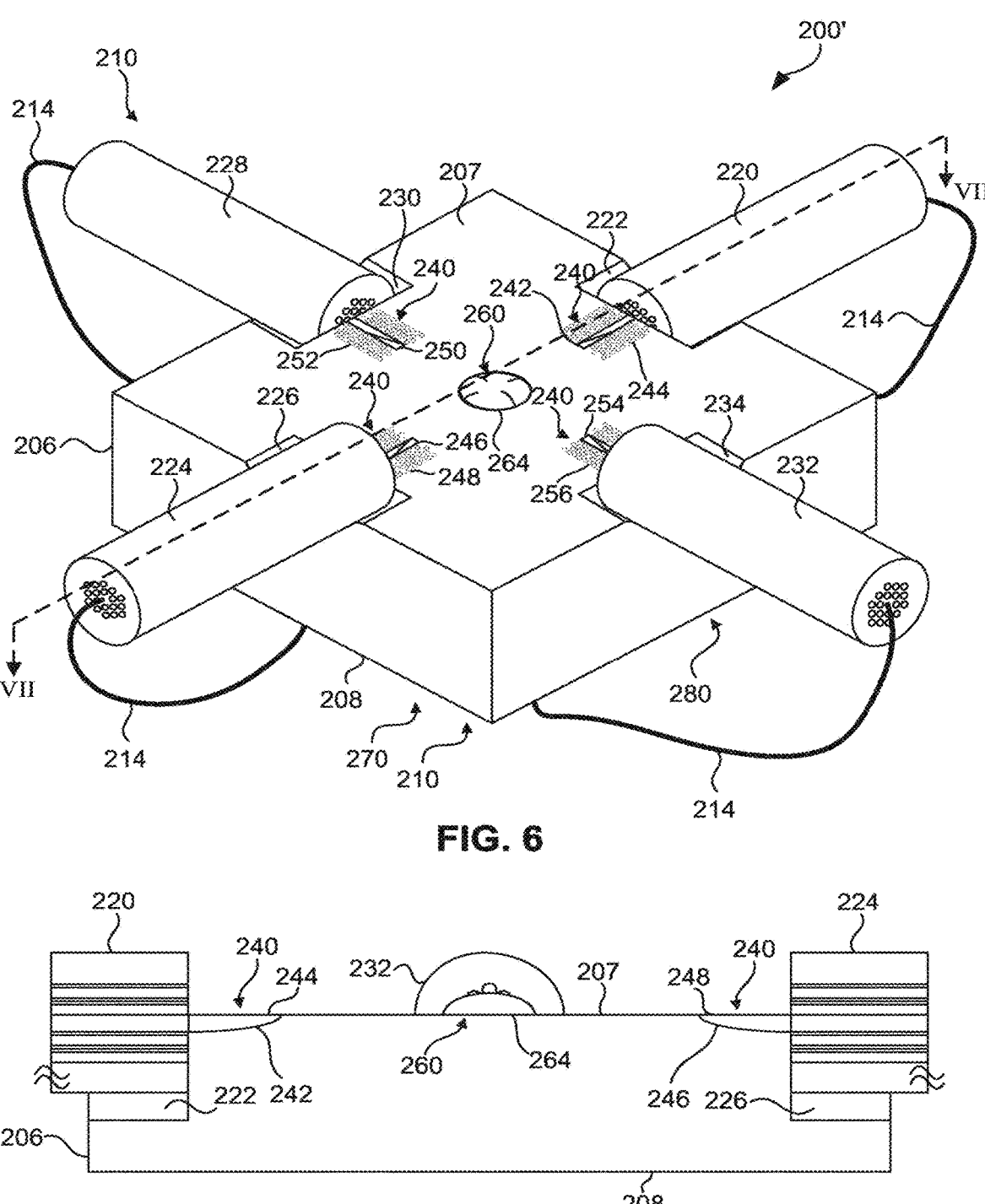
FIG. 6 is a bottom perspective schematic illustration of a sensor apparatus, according to an exemplary embodiment.
FIG. 7 is a cross-sectional schematic illustration of the sensor apparatus of FIG. 6.

FIG. 3 illustrates a bottom perspective schematic of sensor apparatus 200 as shown in FIG. 2. As shown in FIGS. 2 and 3, illumination system 210 can include first PCF 220, second PCF 224, third PCF 228, and fourth PCF 232. The plurality of PCFs 220, 224, 228, 232 are disposed on sensor chip 206 and each is coupled to first optical system 240. For example, as shown in FIG. 6, first PCF 220 is adjacent first mirror 242 and first photonic crystal waveguide 244 of first optical system 240, second PCF 224 is adjacent second mirror 246 and second photonic crystal waveguide 248 of first optical system 240, third PCF 228 is adjacent third mirror 250 and third photonic crystal waveguide 252 of first optical system 240, and fourth PCF 232 is adjacent fourth mirror 254 and fourth photonic crystal waveguide 256 of first optical system 240. As shown in FIG. 3, the plurality of PCFs 220, 224, 228, 232 can be arranged symmetrically relative to each other and configured to focus illumination beam 216 onto diffraction target 204. For example, the plurality of PCFs 220, 224, 228, 232 can be separated by 90 degrees relative to each other. As shown in FIGS. 2 and 3, the plurality of PCFs 220, 224, 228, 232 can be disposed on sensor chip 206 and secured to sensor chip 206 via first fiber coupling 222, second fiber coupling 226, third fiber coupling 230, and fourth fiber coupling 234, respectively. For example, fiber couplings 222, 226, 230, 234 can be an epoxy, glue, or cement. In some embodiments, first, second, third, and fourth couplings 222, 226, 230, 234 can each couple to any on chip waveguide, for example, including a slot, a hollow strip, a rib, or a ridge configuration.

In some embodiments, the plurality of PCFs 220, 224, 228, 232 can be identical in structure (e.g., bandgap) and material. In some embodiments, the plurality of PCFs 220, 224, 228, 232 can each be different in terms of structure (e.g., bandgap) and material. In some embodiments, the plurality of PCFs 220, 224, 228 can be separated by 120 degrees relative to each other.

First optical system 240 is configured to receive illumination beam 216 from illumination system 210 and transmit illumination beam 216 toward diffraction target 204 on substrate 202, disposed adjacent to sensor chip 206, and generate signal beam 290. Signal beam 290 includes diffraction order sub-beams generated from diffraction target 204. For example, as shown in FIG. 2, signal beam 290 includes first diffraction order sub-beam 292, second diffraction order sub-beam 294, and third diffraction order sub-beam 296.

In some embodiments, first diffraction order sub-beam 292 can be a zeroth diffraction order sub-beam, second diffraction order sub-beam 294 can be a first diffraction order sub-beam (e.g., −1), and third diffraction order sub-beam 296 can be a first diffraction order sub-beam (e.g., +1). As shown in FIG. 2, diffraction order sub-beams 292, 294, 296 are transmitted toward second optical system 260.

Figure 4:
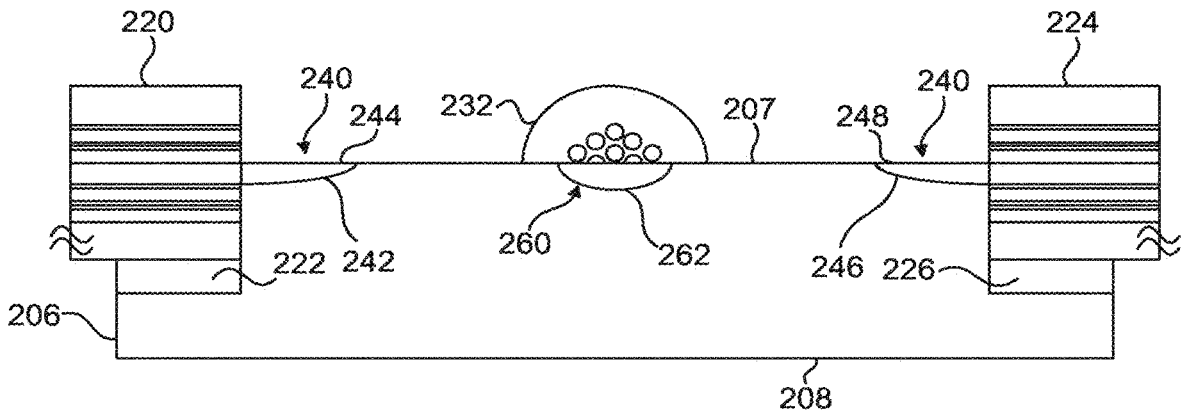
FIG. 4 is a cross-sectional schematic illustration of the sensor apparatus of FIG. 3.
Figure 5:
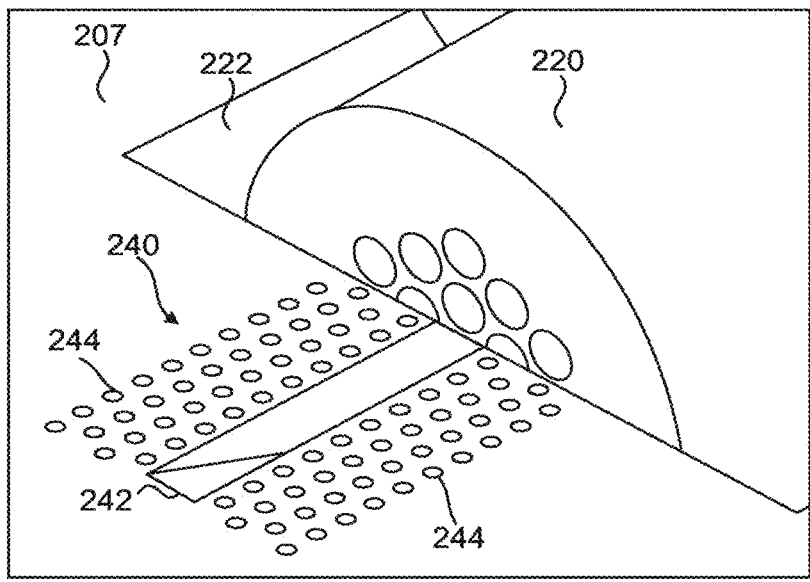
FIG. 5 is an enlarged bottom perspective schematic illustration of the sensor apparatus of FIG. 3.

FIG. 4 illustrates a cross-sectional schematic of sensor apparatus 200 as shown in FIG. 3. Illumination source 212, illumination coupling 214, detector system 270, and processor 280 are omitted from FIG. 4 for clarity. FIG. 5 illustrates an enlarged bottom perspective schematic of sensor apparatus 200 as shown in FIG. 3.

First optical system 240 is coupled to sensor chip 206. For example, as shown in FIGS. 2-5, first optical system 240 can be integrated along first side 207 of sensor chip 206. First optical system 240 includes first integrated optic configuration 242, 244. For example, as shown in FIGS. 3 and 5, first optical system 240 can include first mirror 242 and first photonic crystal waveguide (PCW) 244. In some embodiments, first mirror 242 can include a microelectromechanical system (MEMS)-based actuator configured to focus illumination beam 216 onto diffraction target 204. For example, MEMS-based actuator of first mirror 242 can control a focal spot of illumination beam 216 on diffraction target 204. In some embodiments, first mirror 242 can be an adjustable flat, angled, parabolic, or elliptical mirror. In some embodiments, first mirror 242 can be fabricated on first side 207 of sensor chip 206.

Photonic crystal waveguides (PCWs) are physical structures that guide photons due to their periodic optical nanostructure and restrict expansion to one or two dimensions avoiding energy loss. A two-dimensional rectangular waveguide is a class of PCWs which is formed when a guiding layer of a planar waveguide is restricted in both transverse directions. As shown in FIGS. 3 and 5, first PCW 244 can be a two-dimensional rectangular waveguide configured to transmit illumination beam 216 from first PCF 220 to diffraction target 204. In some embodiments, first PCW 244 has the same bandgap as first PCF 220 and is configured to preserve the same operating wavelength band of illumination beam 216 and avoid power and/or spectral loss.

As shown in FIGS. 3 and 5, first optical system 240 can be integrated along first side 207 of sensor chip 206 adjacent the plurality of PCFs 220, 224, 228, 232. First optical system 240 includes first integrated optic configuration 242, 244, 246, 248, 250, 252, 254, 256. For example, as shown in FIG. 3, first optical system 240 can include first mirror 242 and first PCW 244 adjacent to and coupled to first PCF 220, second mirror 246 and second PCW 248 adjacent to and coupled to second PCF 224, third mirror 250 and third PCW 252 adjacent to and coupled to third PCF 228, and/or fourth mirror 254 and fourth PCW 256 adjacent to and coupled to fourth PCF 232. As shown in FIG. 3, the plurality of mirrors 242, 246, 250, 254 and the plurality of PCWs 244, 248, 252, 256, respectively, may be arranged symmetrically relative to each other and configured to focus illumination beam 216 onto diffraction target 204. For example, the plurality of mirrors 242, 246, 250, 254 and the plurality of PCWs 244, 248, 252, 256, respectively, may be separated by 90 degrees relative to each other. As shown in FIG. 3, the plurality of mirrors 242, 246, 250, 254 and the plurality of PCWs 244, 248, 252, 256, respectively, may be integrated (e.g., fabricated) on first side 207 of sensor chip 206.

In some embodiments, the plurality of mirrors 242, 246, 250, 254 can be identical in structure (e.g., shape) and material. In some embodiments, the plurality of PCWs 244, 248, 252, 256 can be identical in structure (e.g., bandgap) and material. In some embodiments, the plurality of PCWs 244, 248, 252, 256 can each be different in terms of structure (e.g., bandgap) and material. In some embodiments, the plurality of mirrors 242, 246, 250 and the plurality of PCWs 244, 248, 252 can be separated by 120 degrees relative to each other.

Second optical system 260 is configured to collect and transmit signal beam 290 from first side 207 to second side 208 of sensor chip 206. Second optical system 260 includes second integrated optic configuration 262. For example, as shown in FIGS. 2-4, second integrated optic configuration 262 can be negative lens 262. Second optical system 260 is coupled to sensor chip 206. For example, as shown in FIG. 2, negative lens 262 can be integrated (e.g., fabricated) along first side 207 of sensor chip 206. Second optical system 260 can be any suitable optically transparent structure configured to collect and transmit signal beam 290 generated from diffraction target 204. For example, negative lens 262 can be a semiconductor (e.g., Si, Ge, SiGe, GaAs, etc.) or an oxide (e.g., $SiO_x$, $SiN_x$, $ZnO_x$, $NiO_x$, $SnO_x$, $In_xO_x$, $Al_xO_x$, $Ga_xO_x$, $CaO_x$, $CuO_x$, ITO, etc.).

Figures 8, 9:
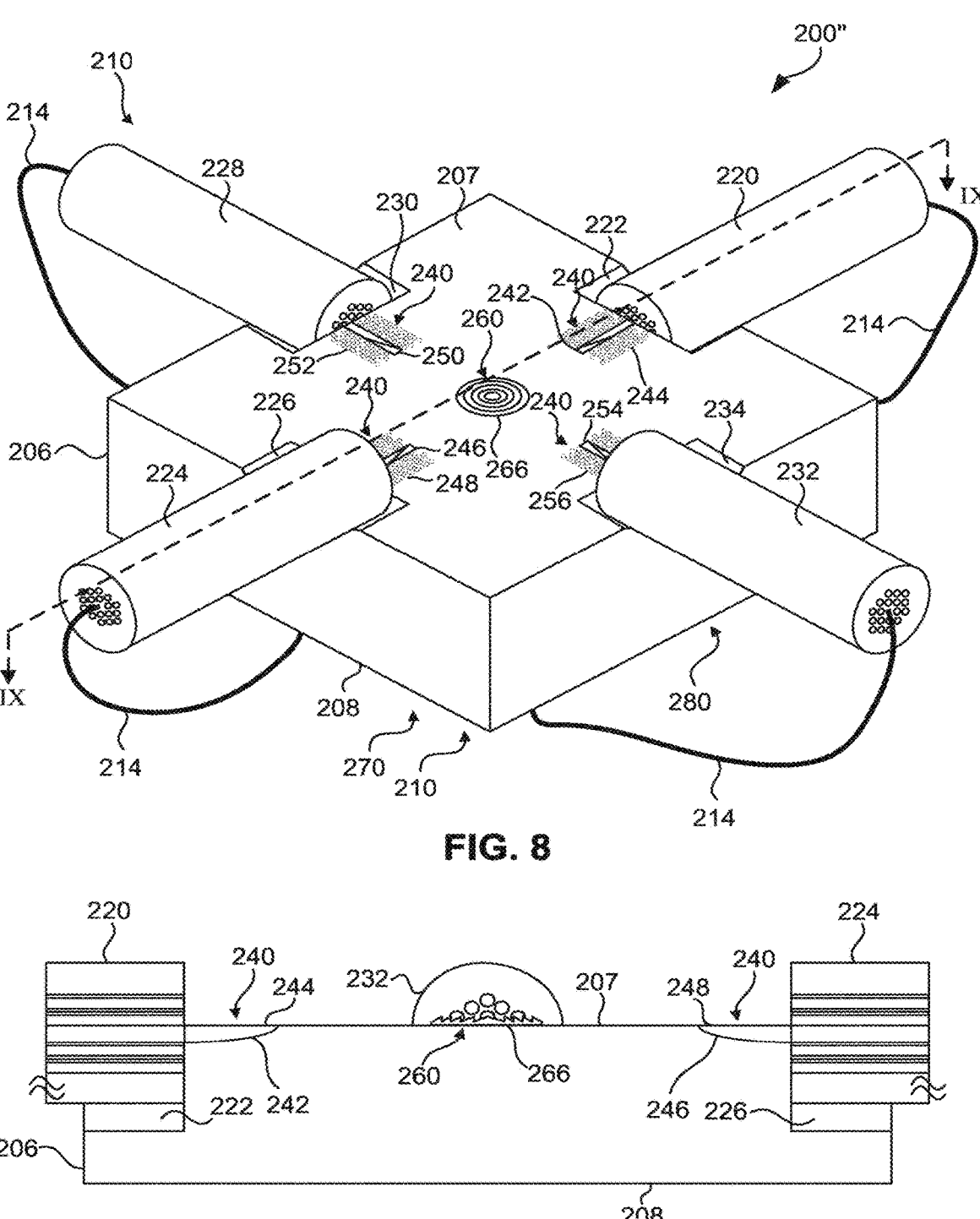
FIG. 8 is a bottom perspective schematic illustration of a sensor apparatus, according to an exemplary embodiment.
FIG. 9 is a cross-sectional schematic illustration of the sensor apparatus of FIG. 8.
Figures 10, 11:
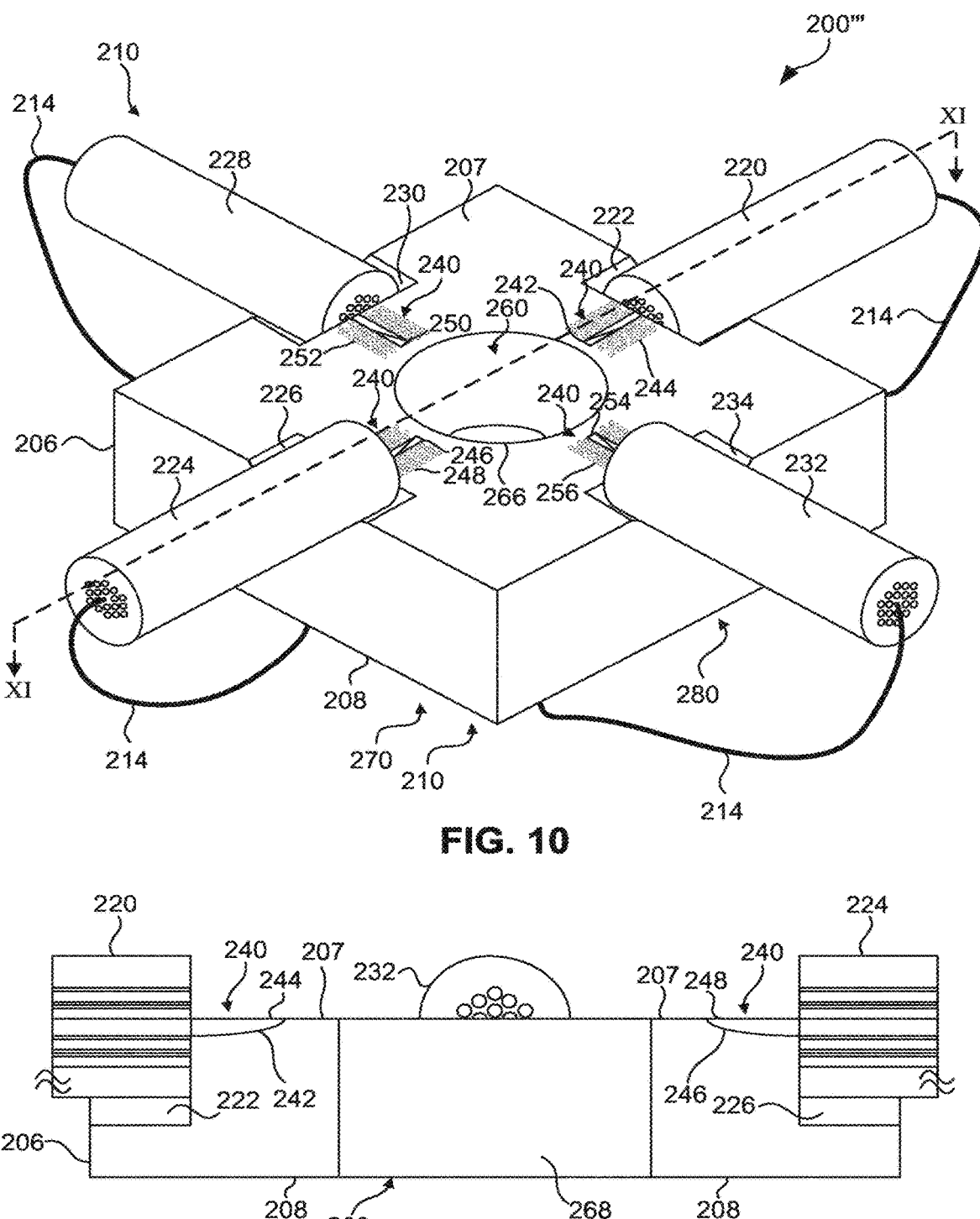
FIG. 10 is a bottom perspective schematic illustration of a sensor apparatus, according to an exemplary embodiment.
FIG. 11 is a cross-sectional schematic illustration of the sensor apparatus of FIG. 10.

In some embodiments, second optical system 260 can include negative lens 262, positive lens 264, meta lens (meta surface) 266, or through-hole 268. For example, as shown in FIG. 2, second optical system 260 includes negative lens 262. For example, as shown in FIG. 6, second optical system 260 includes positive lens 264. For example, as shown in FIG. 8, second optical system 260 includes meta lens (meta surface) 266. For example, as shown in FIG. 10, second optical system 260 includes through-hole 268.

Detector system 270 is configured to measure a characteristic of diffraction target 204 based on signal beam 290 transmitted by second optical system 260. Detector system 270 can be integrated with sensor chip 206 or external to sensor chip 206. For example, as shown in FIG. 2, detector system 270 is disposed on second side 208 of sensor chip 206. Detector system 270 can include a single detector. As shown in FIG. 2, detector system may include focusing optic 272, wavelength filter 274, first detector 276, and/or second detector 278. Focusing optic 272 is configured to collect signal beam 290 from second optical system 260 and focus signal beam 290 toward wavelength filter 274, first detector 276, and/or second detector 278. Wavelength filter 274 is configured to separate different wavelengths of signal beam 290 and transmit the different wavelengths to first and second detectors 276, 278. As shown in FIG. 2, first detector 276 can be configured to detect an infrared (IR) range of signal beam 290 while second detector 278 can be configured to detect an ultraviolet-visible (UV-VIS) range of signal beam 290. For example, first detector 276 can be configured to detect signal beam 290 from about 700 nm to about 2000 nm and second detector 278 can be configured to detect signal beam 290 from about 10 nm to about 700 nm. In some embodiments, the characteristic of diffraction target 204 measured by detector system 270 is an overlay measurement (e.g., overlay error).

In an embodiment, diffraction target 204 can be an alignment mark. In an embodiment, substrate 202 can be supported by a stage and centered along an alignment axis. In some embodiments, diffraction target 204 on substrate 202 can be a 1-D grating, which is printed such that after development, bars are formed of solid resist lines. In some embodiments, diffraction target 204 can be a 2-D array or grating, which is printed such that, after development, a grating is formed of solid resist pillars or vias in the resist. For example, bars, pillars, or vias may alternatively be etched into substrate 202. In some embodiments, second optical system 260 can be positioned at the pupil plane. The pupil plane is the plane in which the radial position of radiation defines the angle of incidence and the angular position defines the azimuth angle of the radiation.

Processor 280 is configured to determine a processing error (e.g., overlay measurement, OPAE, etc.) based on the characteristic of diffraction target 204 detected by detector system 270. Processor 280 can be integrated with sensor chip 206 or external to sensor chip 206. For example, as shown in FIG. 2, processor 280 is disposed on second side 208 of sensor chip 206. As shown in FIG. 2, processor 280 can include first control signal 282 and second control signal 284. First control signal 282 is configured to send and receive data between first detector 276 and processor 280. Second control signal 284 is configured to send and receive data between second detector 278 and processor 280. Processor 280 is coupled to detector system 270 via first and/or second control signals 282, 284.

Alternative Sensor Apparatuses

Figure 12:
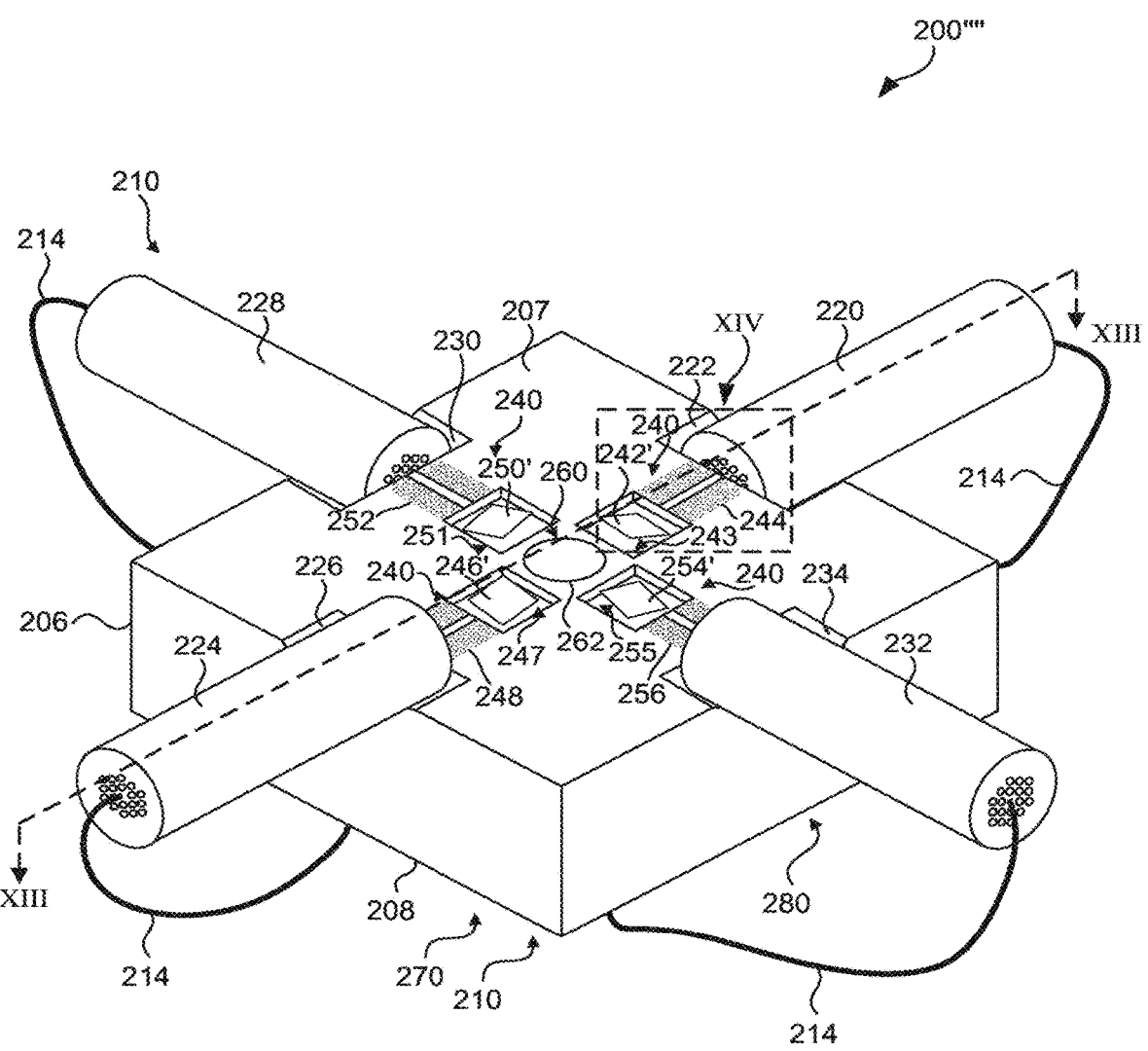
FIG. 12 is a bottom perspective schematic illustration of a sensor apparatus, according to an exemplary embodiment.
Figure 13:
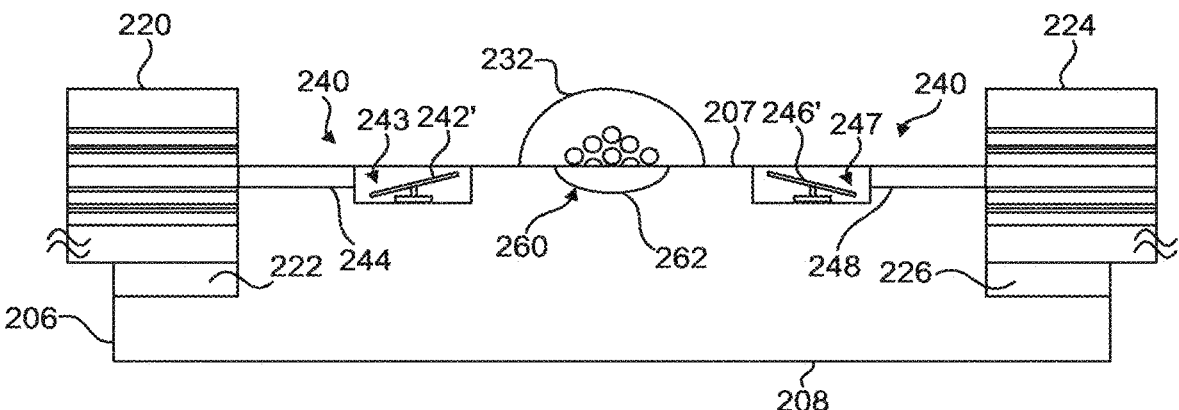
FIG. 13 is a cross-sectional schematic illustration of the sensor apparatus of FIG. 12.
Figure 14:
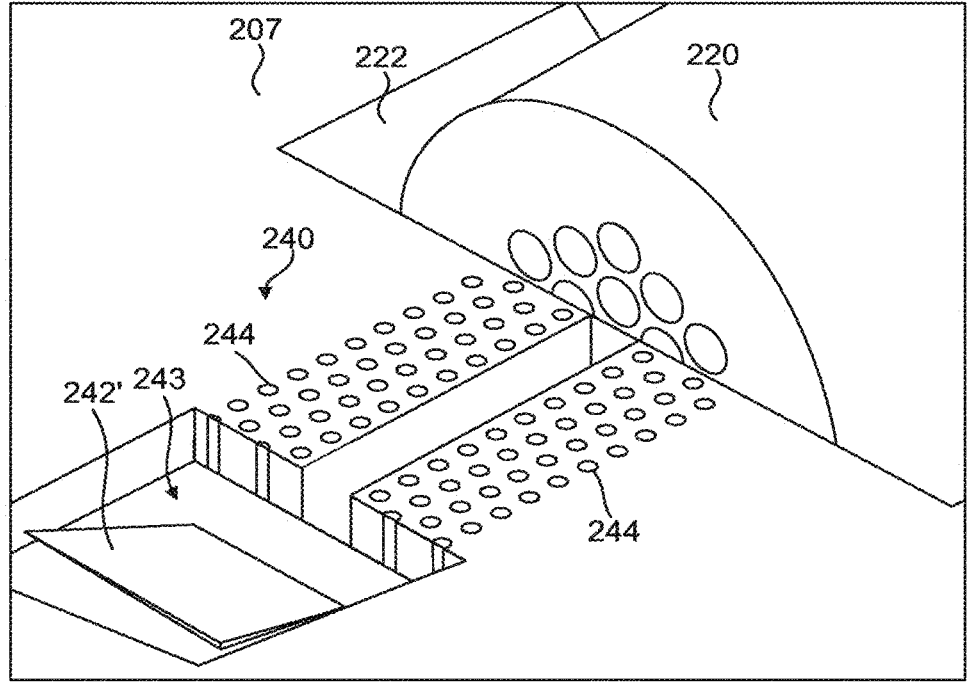
FIG. 14 is an enlarged bottom perspective schematic illustration of the sensor apparatus of FIG. 12.

FIGS. 6-11 illustrate alternative second optical systems 260 for sensor apparatus 200, according to various embodiments. FIGS. 12-14 illustrate alternative first optical systems 240 for sensor apparatus 200, according to various embodiments.

FIG. 6 illustrates a bottom perspective schematic of sensor apparatus 200', according to an exemplary embodiment. FIG. 7 illustrates a cross-sectional schematic of sensor apparatus 200' as shown in FIG. 6. The embodiments of sensor apparatus 200 shown in FIGS. 2-5 and the embodiments of sensor apparatus 200' shown in FIGS. 6 and 7 are similar. Similar reference numbers are used to indicate similar features of the embodiments of sensor apparatus 200 shown in FIGS. 2-5 and the similar features of the embodiments of sensor apparatus 200' shown in FIGS. 6 and 7. The main difference between the embodiments of sensor apparatus 200 shown in FIGS. 2-5 and the embodiments of sensor apparatus 200' shown in FIGS. 6 and 7 is that second optical system 260 includes positive lens 264 on sensor chip 206, replacing negative lens 262.

FIG. 8 illustrates a bottom perspective schematic of sensor apparatus 200", according to an exemplary embodiment. FIG. 9 illustrates a cross-sectional schematic of sensor apparatus 200" as shown in FIG. 8. The embodiments of sensor apparatus 200 shown in FIGS. 2-5 and the embodiments of sensor apparatus 200" shown in FIGS. 8 and 9 are similar. Similar reference numbers are used to indicate similar features of the embodiments of sensor apparatus 200 shown in FIGS. 2-5 and the similar features of the embodiments of sensor apparatus 200" shown in FIGS. 8 and 9. The main difference between the embodiments of sensor apparatus 200 shown in FIGS. 2-5 and the embodiments of sensor apparatus 200" shown in FIGS. 8 and 9 is that second optical system 260 includes meta lens (meta surface) 266 on sensor chip 206, replacing negative lens 262. For example, as shown in FIGS. 8 and 9, meta lens (meta surface) 266 can be a flat Fresnel lens. In some embodiments, meta lens (meta surface) 266 can be a nanostructured surface lens. For example, meta lens (meta surface) 266 can be an ultra-thin meta lens (e.g., flat, micron thick) capable of correcting chromatic aberrations, a meta lens with meta-atoms (i.e., pixels) of different complex shapes (e.g. different cross-sectional shapes), a meta lens with a flat form factor, a meta lens with different nanopillars (e.g., different refractive index), or some combination thereof.

FIG. 10 illustrates a bottom perspective schematic of sensor apparatus 200", according to an exemplary embodiment. FIG. 11 illustrates a cross-sectional schematic of sensor apparatus 200" as shown in FIG. 10. The embodiments of sensor apparatus 200 shown in FIGS. 2-5 and the embodiments of sensor apparatus 200" shown in FIGS. 10 and 11 are similar. Similar reference numbers are used to indicate similar features of the embodiments of sensor apparatus 200 shown in FIGS. 2-5 and the similar features of the embodiments of sensor apparatus 200" shown in FIGS. 10 and 11. The main difference between the embodiments of sensor apparatus 200 shown in FIGS. 2-5 and the embodiments of sensor apparatus 200" shown in FIGS. 10 and 11 is that second optical system 260 includes through-hole 268 through first side 207 and second side 208 of sensor chip 206, replacing negative lens 262.

FIG. 12 illustrates a bottom perspective schematic of sensor apparatus 200"", according to an exemplary embodiment. FIG. 13 illustrates a cross-sectional schematic of sensor apparatus 200"" as shown in FIG. 12. FIG. 14 illustrates an enlarged bottom perspective schematic of sensor apparatus 200"" as shown in FIG. 12. The embodiments of sensor apparatus 200 shown in FIGS. 2-5 and the embodiments of sensor apparatus 200" shown in FIGS. 12-14 are similar. Similar reference numbers are used to indicate similar features of the embodiments of sensor apparatus 200 shown in FIGS. 2-5 and the similar features of the embodiments of sensor apparatus 200" shown in FIGS. 12-14. The main difference between the embodiments of sensor apparatus 200 shown in FIGS. 2-5 and the embodiments of sensor apparatus 200" shown in FIGS. 12-14 is that first optical system 240 includes first MEMS mirror 242' disposed in first MEMS cavity 243 in first side 207 adjacent first photonic crystal waveguide 244, second MEMS mirror 246' disposed in second MEMS cavity 247 in first side 207 adjacent second photonic crystal waveguide 248, third MEMS mirror 250' disposed in third MEMS cavity 251 in first side 207 adjacent third photonic crystal waveguide 252, and fourth MEMS mirror 254' disposed in fourth MEMS cavity 255 in first side 207 adjacent fourth photonic crystal waveguide 256.

In some embodiments, first, second, third, and fourth MEMS mirrors 242', 246', 250', 254' can include a MEMS-based actuator configured to focus illumination beam 216 onto diffraction target 204. For example, a MEMS-based actuator of first, second, third, or fourth MEMS mirrors 242', 246', 250', 254' can control a focal spot of illumination beam 216 on diffraction target 204. In some embodiments, first, second, third, and/or fourth MEMS mirrors 242'. 246', 250', 254' can be an adjustable flat, angled, parabolic, or elliptical mirror. For example, as shown in FIG. 12, first, second, third, and fourth MEMS mirrors 242', 246', 250', 254' can be an adjustable flat mirror. In some embodiments, first, second, third, and fourth MEMS mirrors 242', 246', 250', 254' can each be fabricated on first side 207 of sensor chip 206. For example, as shown in FIG. 12, first, second, third, and fourth MEMS mirrors 242', 246', 250', 254' can be disposed in first, second, third, and fourth MEMS cavity 243, 247, 251, 255 formed in first side 207 of sensor chip 206, for example, by etching or lithographic processing.

Exemplary Detection System

Figure 15:
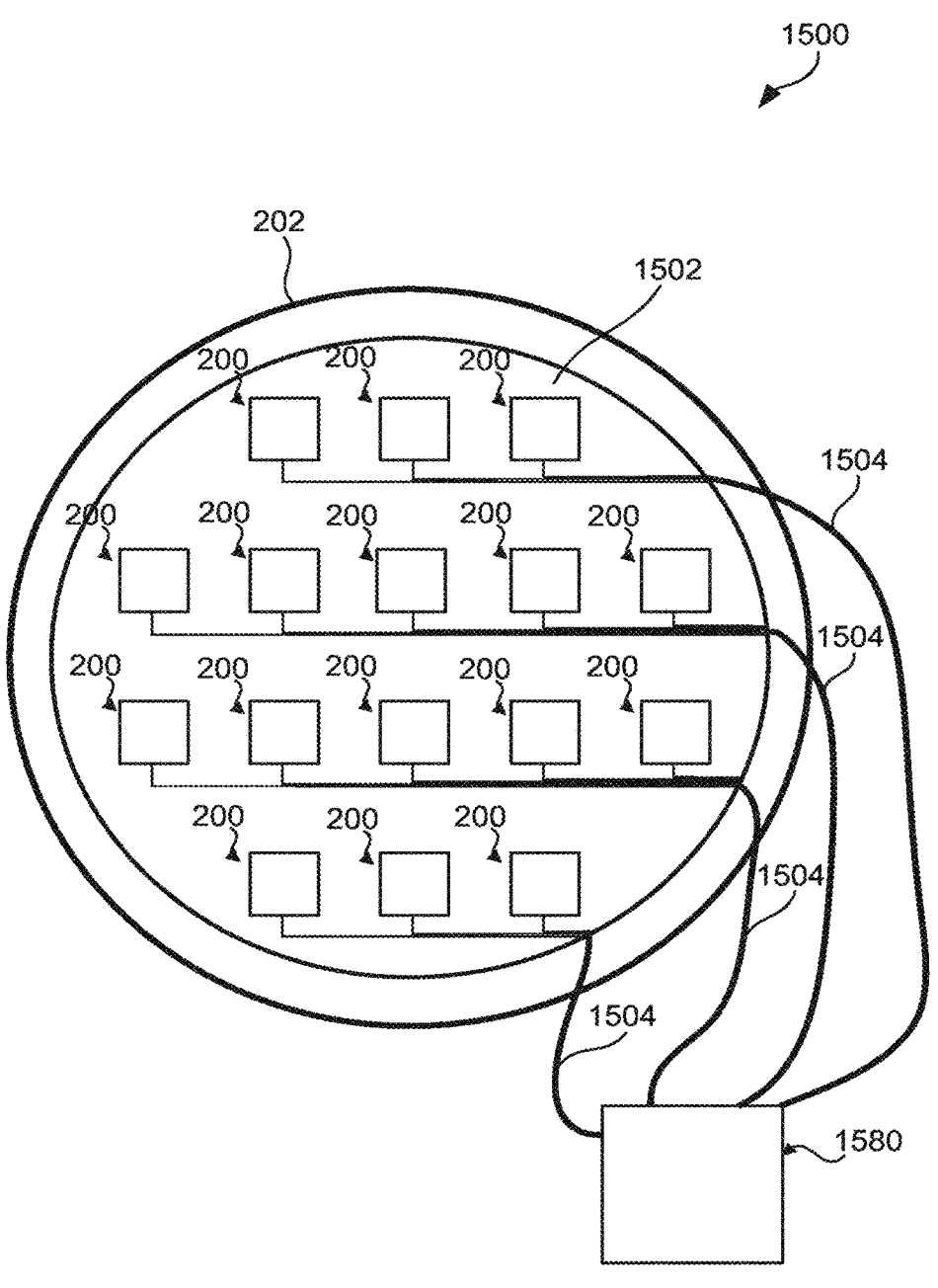
FIG. 15 is a top plan schematic illustration of a detection system, according to an exemplary embodiment.

FIG. 15 illustrates a top plan schematic of detection system 1500, according to an exemplary embodiment. Detection system 1500 is configured to measure a characteristic (e.g., overlay error, OPAE, etc.) of a plurality of diffraction targets 204, similar to diffraction target 204, on substrate 202 and determine a processing error based on the characteristic of each diffraction target 204 of the plurality of diffraction targets 204 on substrate 202. Detection system 1500 can correct a processing error (e.g., OPAE, etc.) or overlay error and improve overlay, for example, in lithographic apparatus LA. Detection system 1500 includes a plurality of sensors 200, each similar to sensor apparatus 200, sensor apparatus 200', sensor apparatus 200", sensor apparatus 200', and/or sensor apparatus 200", and processor 1580. As shown in FIG. 15, each sensor apparatus 200 can be disposed on common platform 1502 and coupled to processor 1580. For example, as shown in FIG. 15, each sensor apparatus 200 can be connected to processor 1580 via optical fiber 1504. Common platform 1502 and the plurality of sensors 200 are disposed above the plurality of diffraction targets 204. Although detection system 1500 is shown in FIG. 15 as a stand-alone apparatus, the embodiments of this disclosure are not limited to this example, and detection system 1500 embodiments of this disclosure can be used with or used in other optical systems, such as, but not limited to, lithographic apparatus LA and/or other optical systems.

In some embodiments, as shown in FIG. 15, a sensor array may be formed of the plurality of sensors 200 disposed on common platform 1502. In some embodiments, the plurality of sensors 200 can be arranged symmetrically relative to each other on common platform 1502. In some embodiments, the characteristic of diffraction target 204 is an overlay measurement. In some embodiments, each detector system 270 of the plurality of sensors 200 measures the characteristic of the plurality of diffraction targets 204 disposed under each sensor 200 on substrate 202 simultaneously or in real-time. For example, a plurality of characteristics of a plurality of diffraction targets 204 measured by a plurality of sensors 200 can occur within 0.2 seconds.

Exemplary Flow Diagram

Figure 16:
FIG. 16 illustrates a flow diagram for correcting a processing error, according to an exemplary embodiment.
Figure 16:
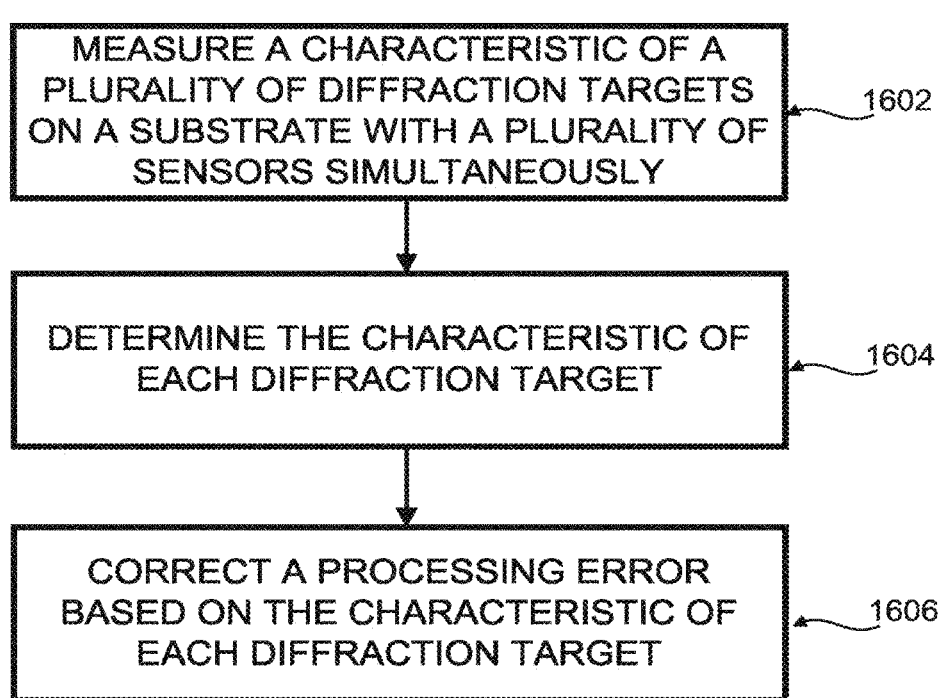

FIG. 16 illustrates flow diagram 1600 for correcting a processing error (e.g., overlay measurement, OPAE, etc.), according to an embodiment. It is to be appreciated that not all steps in FIG. 16 can be needed to perform the disclosure provided herein. Further, some of the steps may be performed simultaneously, or in a different order than shown in FIG. 16. Flow diagram 1600 shall be described with reference to FIG. 15. However, flow diagram 1600 is not limited to those example embodiments.

In step 1602, as shown in the example of FIG. 15, a characteristic of a plurality of diffraction targets 204 on substrate 202 are measured with a plurality of sensors 200. For example, the measurement of the characteristic of the plurality of diffraction targets 204 can occur simultaneously or in real-time, for example, within 0.2 seconds.

In step 1604, as shown in the example of FIG. 15, the characteristic of each diffraction target 204 on substrate 202 are determined by processor 1580. For example, after detection of the characteristic of the plurality of diffraction targets 204 by the plurality of sensors 200, the data may be received by processor 1580 via optical fiber 1504.

In step 1606, as shown in the example of FIG. 15, a processing error is corrected based on the determined characteristic of each diffraction target 204. For example, the corrected processing error may be an overlay error of lithographic apparatus LA, sensor apparatus 200, or substrate 202.

In some embodiments, the characteristic of diffraction target 204 is an overlay measurement. In some embodiments, flow diagram 1600 further includes, as shown in the examples of FIGS. 2, 12, and 15, adjusting mirrors 242, 246, 250, 254 of first optical system 240 (as shown in FIG. 2) or adjusting MEMS mirrors 242', 246', 250', 254' of first optical system 240 (as shown in FIG. 12) to an out-of-focus position on diffraction target 204. For example, adjusting MEMS-based actuator of mirrors 242, 246, 250, 254 or adjusting MEMS mirrors 242', 246', 250', 254' and subsequently repeating steps 1602, 1604, and 1606 for an out-of-focus measurement, determination, and correction, respectively.

In some embodiments, processor 1580 can feed corrections back to lithographic apparatus LA and/or sensor apparatus 200 for correcting errors, for example, in the overlay offset, for example, by feeding corrections into sensor apparatus 200 and/or processor 1580 and processing substrate 202 using the corrected processing. Substrate 202 can be processed using known manufacturing processes by a lithographic projection apparatus, and a pattern (e.g., overlay marker or a product pattern in a reticle) can be imaged onto substrate 202 that is at least partially covered by a layer of radiation-sensitive material (resist). Prior to this imaging, substrate 202 can undergo various procedures, such as priming, resist coating, and a soft bake. Substrate 202 can be aligned in calibrated sensor apparatus 200 prior to exposure. After exposure, substrate 202 can be subjected to other procedures, such as a post-exposure bake (PEB), development, a hard bake, and measurement/inspection of the imaged features. Thus, substrate 202 can be exposed with an overlay marker along with a product pattern and the resist can be developed to print the overlay marker on the stacked wafer.

In some embodiments, processor 1580 can measure printed pattern position offset error with respect to the sensor estimate for each alignment mark or diffraction target 204 on exposed substrate 202. The measurement information includes but is not limited to the product stack profile, measurements of overlay, critical dimension, and/or focus of each alignment mark or diffraction target 204 on substrate 202. Processor 1580 can utilize a clustering algorithm to group the marks into sets of similar constant offset errors, and create an overlay error offset correction table based on the information. The clustering algorithm may be based on overlay measurement, the position estimates, and/or additional optical stack process information associated with each set of offset errors. From this measured overlay and the known programmed overlay of its corresponding target, the overlay error can be deduced.

In some embodiments, processor 1580 can determine corrections for each mark and feed corrections back to lithographic apparatus LA and/or sensor apparatus 200 for correcting errors in the overlay, for example, by feeding corrections into sensor apparatus 200. Thus, the process creates a self-learning feedback loop for calibrating sensor apparatus 200.

Other aspects of the invention are set out in the following numbered clauses.

1. A sensor apparatus comprising:
    a sensor chip comprising a first side and a second side opposite the first side;
    an illumination system coupled to the sensor chip and configured to transmit an illumination beam along an illumination path;
    a first optical system coupled to the sensor chip and comprising a first integrated optic configuration to configure and transmit the illumination beam toward a diffraction target on a substrate, disposed adjacent to the sensor chip, and generate a signal beam comprising diffraction order sub-beams generated from the diffraction target;
    a second optical system coupled to the sensor chip and comprising a second integrated optic configuration to collect and transmit the signal beam from the first side to the second side of the sensor chip; and
    a detector system configured to measure a characteristic of the diffraction target based on the signal beam transmitted by the second optical system.

2. The sensor apparatus of clause 1, wherein the characteristic of the diffraction target is an overlay measurement.

3. The sensor apparatus of clause 1, wherein the illumination system comprises a photonic crystal fiber disposed on the sensor chip and coupled to the first optical system.

4. The sensor apparatus of clause 3, wherein the first integrated optic configuration comprises a mirror and a photonic crystal waveguide disposed on the first side of the sensor chip.

5. The sensor apparatus of clause 4, wherein the mirror comprises a microelectromechanical system-based actuator configured to focus the illumination beam onto the diffraction target.

6. The sensor apparatus of clause 4, wherein:
    the photonic crystal waveguide comprises the same bandgap as the photonic crystal fiber; and
    the illumination beam wavelength is about 400 nm to about 2000 nm.

7. The sensor apparatus of clause 1, wherein the illumination system comprises a plurality of photonic crystal fibers disposed on the sensor chip and coupled to the first optical system comprising a plurality of photonic crystal waveguides.

8. The sensor apparatus of clause 7, wherein the plurality of photonic crystal fibers and the plurality of photonic crystal waveguides are arranged symmetrically relative to each other and configured to focus the illumination beam onto the diffraction target.

9. The sensor apparatus of clause 1, wherein an area of the first side of the sensor chip is no greater than about 5 mm by 5 mm.

10. The sensor apparatus of clause 1, wherein the second integrated optic configuration comprises a negative lens, a positive lens, a meta lens, or a through-hole.

11. The sensor apparatus of clause 10, wherein the meta lens is a flat Fresnel lens.

12. The sensor apparatus of clause 10, wherein the meta lens is a nanostructured surface lens.

13. The sensor apparatus of clause 1, wherein the detector system comprises a first detector, a second detector, a wavelength filter, and a focusing optic.

14. The sensor apparatus of clause 1, wherein the first detector is configured to detect an infrared range of the signal beam from about 700 nm to about 2000 nm and the second detector is configured to detect an ultraviolet-visible range of the signal beam from about 10 nm to about 700 nm.

15. The sensor apparatus of clause 1, wherein the illumination system, the first optical system, and the second optical system are integrated on the sensor chip.

16. A detection system comprising:
   a plurality of sensors arranged symmetrically relative to each other and disposed above a plurality of diffraction targets on a substrate, each sensor comprising:
      a sensor chip comprising a first side and a second side opposite the first side;
   an illumination system coupled to the sensor chip and configured to transmit an illumination beam along an illumination path;
      a first optical system coupled to the sensor chip and comprising a first integrated optic configuration to configure and transmit the illumination beam toward a diffraction target on the substrate, disposed adjacent to the sensor chip, and generate a signal beam comprising diffraction order sub-beams generated from the diffraction target;
      a second optical system coupled to the sensor chip and comprising a second integrated optic configuration to collect and transmit the signal beam from the first side to the second side of the sensor chip; and
      a detector system configured to measure a characteristic of the diffraction target based on the signal beam transmitted by the second optical system; and
   a processor coupled to each sensor and configured to determine a processing error based on the characteristic of each diffraction target of the plurality of diffraction targets on the substrate.

17. The detection system of clause 16, wherein the characteristic of the diffraction target is an overlay measurement.

18. The detection system of clause 16, wherein each detector system measures the characteristic of the plurality of diffraction targets on the substrate simultaneously.

19. The detection system of clause 16, wherein the plurality of sensors are integrated on a common platform.

20. The detection system of clause 16, wherein the processor is coupled to each sensor via an optical fiber.

21. A method for correcting a processing error, comprising:
   measuring, by a plurality of sensors, a characteristic of a plurality of diffraction targets on the substrate, each sensor comprising:
      a sensor chip comprising a first side and a second side opposite the first side;
   an illumination system coupled to the sensor chip and configured to transmit an illumination beam along an illumination path;
      a first optical system coupled to the sensor chip and comprising a first integrated optic configuration to configure and transmit the illumination beam toward a diffraction target on the substrate, disposed adjacent to the sensor chip, and generate a signal beam comprising diffraction order sub-beams generated from the diffraction target along a signal path;
      a second optical system coupled to the sensor chip and comprising a second integrated optic configuration to collect and transmit the signal beam from the first side to the second side of the sensor chip; and
      a detector system configured to measure the characteristic of the diffraction target based on the signal beam transmitted by the second optical system;
   determining, by a processor coupled to each sensor, the characteristic of each diffraction target; and
   correcting the processing error of a lithographic apparatus, a sensor, or the substrate based on the characteristic of each diffraction target.

22. The method of clause 21, wherein measuring the characteristic of the plurality of diffraction targets on the substrate occurs simultaneously.

23. The method of clause 21, further comprising adjusting the first integrated optic configuration to an out-of-focus position on the diffraction target, wherein the first integrated optic configuration comprises a microelectromechanical system-based adjustable mirror configured to focus the illumination beam toward the diffraction target.

24. A lithographic apparatus comprising:
   an illumination system configured to illuminate a patterning device;
   a projection system configured to project an image of the patterning device onto a substrate; and
   a sensor apparatus configured to measure a characteristic of a diffraction target on the substrate, the sensor apparatus comprising:
      a sensor chip comprising a first side and a second side opposite the first side;
      a second illumination system coupled to the sensor chip and configured to transmit an illumination beam along an illumination path;
      a first optical system coupled to the sensor chip and comprising a first integrated optic configuration to configure and transmit the illumination beam toward the diffraction target on the substrate, disposed adjacent to the sensor chip, and generate a signal beam comprising diffraction order sub-beams generated from the diffraction target;
      a second optical system coupled to the sensor chip and comprising a second integrated optic configuration to collect and transmit the signal beam from the first side to the second side of the sensor chip; and
      a detector system configured to measure the characteristic of the diffraction target based on the signal beam transmitted by the second optical system.

25. The lithographic apparatus of clause 24, wherein the characteristic of the diffraction target is an overlay measurement.

26. The lithographic apparatus of clause 24, wherein an area of the first side of the sensor chip is no greater than about 5 mm by 5 mm.

27. The lithographic apparatus of clause 24, wherein the sensor apparatus comprises a plurality of sensors arranged symmetrically relative to each other and disposed above a plurality of diffraction targets on the substrate.

28. The lithographic apparatus of clause 27, wherein each sensor measures a characteristic of the plurality of diffraction targets on the substrate simultaneously.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A method for correcting a processing error by measuring a characteristic of a diffraction target on a substrate using a sensor comprising a sensor chip comprising a first side and a second side opposite the first side, the method comprising:
   using a first optical system, disposed on the sensor chip and comprising a first integrated optic to transmit an illumination beam toward the diffraction target on the substrate that is disposed adjacent to the sensor chip, to generate a signal beam comprising diffraction order sub-beams generated from the diffraction target along a signal path;

using a second optical system, disposed on the sensor chip and comprising a second integrated optic, to collect and transmit the signal beam from the first side to the second side of the sensor chip; and using a detector system to measure the characteristic of the diffraction target based on the signal beam transmitted by the second optical system;

determining, by a processor coupled to each sensor, the characteristic of the diffraction target; and correcting the processing error of a lithographic apparatus, a sensor, or the substrate based on the characteristic of the diffraction target.

2. The method of claim 1, further comprising measuring characteristics of a plurality of diffraction targets on the substrate simultaneously.

3. The method of claim 1, further comprising adjusting the first integrated optic configuration to an out-of-focus position on the diffraction target, wherein the first integrated optic configuration comprises a microelectromechanical system-based adjustable mirror configured to focus the illumination beam toward the diffraction target.

4. The method of claim 1, further comprises focusing the illumination beam onto the diffraction target using a microelectromechanical system-based actuator.

5. A lithographic apparatus comprising:

an illumination system configured to illuminate a patterning device;

a projection system configured to project an image of the patterning device onto a substrate; and a sensor apparatus configured to measure a characteristic of a diffraction target on the substrate, the sensor apparatus comprising:

a sensor chip comprising a first side and a second side opposite the first side;

a second illumination system disposed on the sensor chip and configured to transmit an illumination beam along an illumination path;

a first optical system disposed on the sensor chip and comprising a first integrated optic configuration to configure and transmit the illumination beam toward the diffraction target on the substrate, disposed adjacent to the sensor chip, and generate a signal beam comprising diffraction order sub-beams generated from the diffraction target;

a second optical system coupled to the sensor chip and comprising a second integrated optic configuration to collect and transmit the signal beam from the first side to the second side of the sensor chip; and a detector system configured to measure the characteristic of the diffraction target based on the signal beam transmitted by the second optical system.

6. The lithographic apparatus of claim 5, wherein the characteristic of the diffraction target is an overlay measurement.

7. The lithographic apparatus of claim 5, wherein an area of the first side of the sensor chip is no greater than about 5 mm by about 5 mm.

8. The lithographic apparatus of claim 5, wherein the sensor apparatus comprises a plurality of sensors arranged symmetrically relative to each other and disposed above a plurality of diffraction targets on the substrate.

9. The lithographic apparatus of claim 5, wherein the illumination system comprises a photonic crystal fiber disposed on the sensor chip and coupled to the first optical system.

10. The lithographic apparatus of claim 5, wherein the first integrated optic configuration comprises a mirror and a photonic crystal waveguide disposed on the first side of the sensor chip.

11. The lithographic apparatus of claim 10, wherein the mirror comprises a microelectromechanical system-based actuator configured to focus the illumination beam onto the diffraction target.

12. The lithographic apparatus of claim 10, wherein:

the photonic crystal waveguide comprises the same bandgap as the photonic crystal fiber; and the illumination beam wavelength is about 400 nm to about 2000 nm.

13. The lithographic apparatus of claim 5, wherein the illumination system comprises a plurality of photonic crystal fibers disposed on the sensor chip and coupled to the first optical system comprising a plurality of photonic crystal waveguides.

14. The lithographic apparatus of claim 13, wherein the plurality of photonic crystal fibers and the plurality of photonic crystal waveguides are arranged symmetrically relative to each other and configured to focus the illumination beam onto the diffraction target.

15. The lithographic apparatus of claim 5, wherein the second integrated optic configuration comprises a negative lens, a positive lens, a meta lens, or a through-hole.

16. The lithographic apparatus of claim 15, wherein the meta lens is a flat Fresnel lens.

17. The lithographic apparatus of claim 15, wherein the meta lens is a nanostructured surface lens.

18. The lithographic apparatus of claim 5, wherein the detector system comprises a first detector, a second detector, a wavelength filter, and a focusing optic.

19. The lithographic apparatus of claim 5, wherein the first detector is configured to detect an infrared range of the signal beam from about 700 nm to about 2000 nm and the second detector is configured to detect an ultraviolet-visible range of the signal beam from about 10 nm to about 700 nm.

20. The lithographic apparatus of claim 5, wherein the illumination system, the first optical system, and the second optical system are integrated on the sensor chip.

* * * * *